(12) United States Patent
Kroll et al.

(10) Patent No.: US 8,518,284 B2
(45) Date of Patent: Aug. 27, 2013

(54) PLASMA TREATMENT APPARATUS AND METHOD FOR PLASMA-ASSISTED TREATMENT OF SUBSTRATES

(75) Inventors: Ulrich Kroll, Corcelles (CH); Boris Legradic, Lausanne (CH)

(73) Assignee: Tel Solar AG, Trubbach (CH)

( * ) Notice: Subject to any disclaimer, the term of this patent is extended or adjusted under 35 U.S.C. 154(b) by 270 days.

(21) Appl. No.: 12/989,967

(22) PCT Filed: Apr. 30, 2009

(86) PCT No.: PCT/EP2009/055307
§ 371 (c)(1),
(2), (4) Date: Oct. 28, 2010

(87) PCT Pub. No.: WO2009/133193
PCT Pub. Date: Nov. 5, 2009

(65) Prior Publication Data
US 2011/0049102 A1    Mar. 3, 2011

Related U.S. Application Data

(60) Provisional application No. 61/049,899, filed on May 2, 2008.

(51) Int. Cl.
*C03C 15/00* (2006.01)
*C03C 25/68* (2006.01)
*C23C 16/50* (2006.01)

(52) U.S. Cl.
USPC .......................... 216/71; 118/723 E (58) Field of Classification Search
None
See application file for complete search history.

(56) References Cited

U.S. PATENT DOCUMENTS

| | | | |
|---|---|---|---|
| 2001/0003014 A1 | 6/2001 | Yuda | |
| 2005/0214477 A1* | 9/2005 | Hanawa et al. | 427/569 |
| 2005/0241583 A1 | 11/2005 | Buechel et al. | |
| 2006/0042545 A1 | 3/2006 | Shibata et al. | |
| 2006/0201414 A1* | 9/2006 | Brabant et al. | 117/89 |
| 2007/0037408 A1* | 2/2007 | Tachibana et al. | 438/778 |

FOREIGN PATENT DOCUMENTS

| | | |
|---|---|---|
| WO | 00/70117 A1 | 11/2000 |
| WO | 2004/051702 A2 | 6/2004 |

OTHER PUBLICATIONS

International Search Report for PCT/EP2009/055307 dated Aug. 13, 2009.

* cited by examiner

*Primary Examiner* — Shamim Ahmed
*Assistant Examiner* — Bradford Gates
(74) *Attorney, Agent, or Firm* — Pearne & Gordon LLP (57) ABSTRACT

A remote plasma source comprises a first plate-like electrode ($7_s$) and a second plate-like electrode ($7_b$) which are arranged in parallelism and mutually electrically DC isolated. The two electrodes ($7_s$, $7_b$) are operationally connected to an Rf generator (11). The first electrode ($7_s$) has a surface which is freely exposed to a substrate holder (3) and has a pattern of through-openings (19) distributed along its surface extent.

25 Claims, 2 Drawing Sheets

PLASMA TREATMENT APPARATUS AND METHOD FOR PLASMA-ASSISTED TREATMENT OF SUBSTRATES

The present invention refers to a plasma treatment apparatus or system and to a method for manufacturing substrates, thereby even large substrates by plasma-assisted surface treatment. Thereby, we understand under "large" a substrate of at least 1 m² extent. We further understand under "plasma assisted treatment" plasma enhanced chemical vapor deposition, PECVD, ion etching or plasma assisted reactive etching, plasma assisted heating and other plasma assisted surface treatments realized by exposing the surface to be treated to ions, electrons or neutral radicals generated with the help of a plasma.

Thereby, the present invention addresses such apparatus and method in which Rf-operated plasma is exploited.

Thereby, we understand throughout the present description and claims under "Rf" an AC signal with a frequency between 100 KHz and 200 MHz, thereby especially with the industrially common frequency of 13.56 MHz and its higher order harmonics.

Widely known in the addressed art of substrate treatment are so-called parallel plate reactors and the respective methods. Principally, in a parallel plate reactor be it in diode or in a triode configuration an Rf plasma is generated between two extended parallel electrodes. The substrate to be treated is disposed on one of the two plasma generating electrodes or, possibly electrically biased (triode configuration) immersed in the Rf plasma generated between the two parallel electrodes. The fact that in such parallel plate reactor the substrate is directly exposed to or immersed into the intense Rf plasma leads to critical control problems e.g. with respect to ion bombardment, standing wave occurrence which especially becomes the more critical the larger that such reactor is conceived with the object of surface treating large and even very large substrates. The present invention is based on a different approach, namely on the approach of "remote plasma" generation.

Throughout the present description and claims we understand under a "remote plasma source" a plasma source within a vacuum recipient for treating a substrate whereby a plasma is generated independent of electrical operation of the substrate and the substrate is positioned in the addressed recipient remote from the plasma as generated. Thus, performing a substrate treatment by means of a remote plasma source is distinctly different from treating such substrate by a parallel electrode Rf plasma apparatus. In latter case the substrate is directly exposed or immersed in the one intense Rf plasma generated and electrical operation of the substrate significantly affects the plasma.

We further understand under the term "DC isolating" as used throughout the present description and claims the electrical isolation with respect to DC electric signals.

Most generically, such a remote plasma source approach is known from the U.S. Pat. No. 7,090,705. According to this reference there is provided a remote plasma source which consists of a first electrically conductive electrode, whereupon in mutual parallelism and with respective spacings bars of electrically DC-isolating material are mounted. The surfaces of these bars remote from the first electrode are covered with respective stripes of electrically conductive material acting as second electrode. An Rf signal is applied between the two electrodes and a plasma is generated in the interspaces between the bars. A process gas is delivered into the interspaces between the bars of DC-isolating material. The substrate is supported on a substrate holder in the vacuum recipient distant from the two-electrode remote plasma source and is substantially not affected by the Rf signal as applied for generating the plasma between the addressed two electrodes and vice versa.

By this remote plasma source, plasma stripes are generated along the length extent of the parallel bars. Along and dependent from this extent standing waves may easily occur which negatively influence treatment distribution upon the substrate. Additionally, the addressed stripe plasma pattern may lead to a respective patterning of plasma treatment on the substrate. Still further, the addressed remote two-electrode plasma source is highly complicated and expensive in manufacturing which becomes a serious disadvantage if a large or very large remote plasma source is to be realized in order to treat large or very large substrates. Moreover and depending on the treatment process to be performed, e.g. with the help of highly aggressive reactive gases, it is evident that the remote plasma source must be subjected to maintenance as for cleaning or replacement. Due to the highly complex structure of the referenced remote plasma source, such maintenance is time-consuming and expensive. This leads, applied to a manufacturing method, to respectively high manufacturing costs.

It is an object of the present invention to remedy at least some of the addressed drawbacks of an apparatus and method as taught by the addressed reference.

This is achieved by a plasma treatment apparatus according to the present invention which comprises a vacuum recipient, a substrate holder for a substrate to be treated and a remote plasma source. The remote plasma source thereby comprises a first plate-like two-dimensionally extended, electrically conductive electrode and a second, two-dimensionally extended, electrically conductive electrode. The first and the second electrodes are substantially parallel and mutually electrically DC-isolated. The first and second electrodes are further operationally connected to an electric Rf generator which generates an Rf signal at a predetermined frequency and with a predetermined power. The first electrode has a surface which is freely exposed to the substrate holder and has a back surface and further comprises a pattern of through-openings distributed along its surface extent.

As was addressed above the apparatus according to the invention as well as the method for manufacturing according to the invention are especially suited to operate on and to manufacture substrates with a large extent of at least 1 m² or even of at least 3 m². Thereby, accordingly, the first and second electrodes are of an extent which is at least substantially equal to the extent of the respective substrate to be treated or to be held in the respective substrate holder.

The second electrode has a surface exposed to the back surface of the first electrode and spaced therefrom by a distance and thereby defining for an interspace between the addressed back surface of the first electrode and the surface exposed to the addressed back surface of the second electrode. The remote plasma source further comprises a pattern of gas discharge openings which abut into the addressed interspace. The through-openings in the first electrode are dimensioned so as to establish a plasma therein at the addressed predetermined Rf frequency, power and at a predetermined gas pressure. Further, the addressed spacing distance defining for the interspace is selected to substantially prevent plasma generation in the interspace at the addressed Rf frequency, power and a predetermined gas pressure in the interspace.

Thus, and according to this apparatus according to the invention, a remote plasma source is provided which in fact substantially consists of two parallel, spaced electrodes of large extent. The interspace between the electrodes is dimensioned to prevent plasma generation therein. Distinct, localized plasmas are generated in through-openings through that electrode which is seen from a substrate to be treated, deposited on a substrate holder. The gas or gas mixture, be it a noble gas and/or a reactive gas or respective gas mixtures, is applied to the interspace. The localized plasmas in the addressed through-openings intensely interact with the addressed working gas or gas mixture as such gas or gas mixture leaves the interspace towards the substrate through the through-openings.

The fact that distinct or localized plasmas are generated distributed along the surface of the remote plasma source which may be large or even very large substantially allows to compensate for negative effects upon treatment homogeneity along the substrate if such standing waves are present. By appropriately selecting the distribution of through-openings along the surface of the one electrode opposite and distant from the substrate and/or the profile of thickness of the addressed electrode plate along its extent and/or the shape and dimension of the addressed through-openings and/or the shape and structure of these openings considered along their axial extent, it becomes possible to accurately compensate for the addressed impacts which may arise if standing waves occur upon the treatment distribution on the substrate.

Further, the electrical operation of a substrate on the substrate holder may be selected substantially independent from the plasma generation and, vice versa, does substantially not influence such plasma generation. The substrate is not exposed to the localized plasmas, but is exposed to the result of plasma-excited gas or gas mixture, i.e. to ions, electrons or neutral radicals from the remote plasma source. If e.g. it is desired to expose the substrate to a plasma, thereby to a plasma of a lower intensity than the addressed localized plasmas, it is possible to operate electrically the addressed substrate to establish for such a desired effect.

In one embodiment of the addressed apparatus according to the invention the second electrode extends adjacent to, along and spaced from a part of the wall of the recipient. Thereby, a further interspace between the second electrode and the addressed part of the wall is established which may be exploited as a gas distribution chamber. Further, in this embodiment the second electrode may be operated at Rf potential, whereas the first electrode may be operated at a reference potential, thereby preferably on ground potential and further preferred on equal potential as the wall of the recipient. This has the significant advantage that the substrate and respectively the substrate holder is in fact surrounded by conductive walls and surfaces which are all on equal electrical potential.

In a further embodiment of the apparatus as was just addressed the addressed part of the wall of the recipient and the second electrode in fact defines for a further interspace. At least one gas inlet line is provided through the addressed part of the wall and abuts in the further interspace. A pattern of further gas inlet lines is provided from the further interspace through the second electrode abutting in the one interspace between first and second electrodes. Thereby, the further interspace between second extended electrode and the part of the wall of the recipient is exploited as gas distribution and equalization chamber, wherein turbulences and pressure differences from gas feed are homogenized.

Under a generic consideration of the apparatus according to the invention there is formed an interspace between the backside of a first electrode—which is provided with the through-holes—and the second electrode. Ignition of the localized plasmas in the addressed through-holes may thereby be facilitated by respectively structuring the surface of one or both addressed surfaces which delimit the addressed interspace. Thus, in one embodiment at least one of the addressed surfaces of the respective electrodes is structured. Thereby, in one embodiment there are present, substantially aligned with at least some of the through-holes in the first electrode, edge-forming structures at least one of the surfaces delimiting the interspace preferably at the second electrode. In one embodiment such structures may be formed by blind holes aligned or substantially aligned with the addressed through-holes.

With an eye on the embodiment addressed above, wherein a further interspace is communicating with the interspace between the first and second electrodes via gas inlet lines, these inlet lines may be thus additionally exploited for enhancing plasma discharge ignition by providing their inlet openings to the addressed interspace aligned with or substantially aligned with at least a part of the through-holes in the first electrode. Clearly and again under a more generic aspect, the addressed surface structure of at least one of the electrode surfaces which delimit the addressed interspace should preferably provide for surface unsteadiness in the neighborhood or aligned with the addressed through-openings as e.g. corners and edges.

In one embodiment of the apparatus according to the invention the first electrode and preferably also the part of the wall of the recipient is/are electrically connected to a reference potential, thereby preferably to ground potential. In this embodiment which is in fact today preferred the second electrode of the remote plasma source is obviously operated on Rf potential. As this second electrode is provided between the part of the wall of the recipient and the first electrode, electrical DC isolation is mandatory on one hand between the first and second electrodes and on the other hand between the second electrode and the part of the wall of the recipient. With an eye on the addressed exploitation of an interspace between the second electrode and the respective part of the wall of the recipient as a gas distribution and equalization chamber the addressed DC-isolation between the addressed part of the wall and the second electrode may be realized by a ring-shaped or frame-shaped DC isolating spacer disposed adjacent to and along the periphery of the second electrode. Thereby, the interspace between the second electrode and the addressed part of the wall becomes substantially encapsulated as a chamber. The same technique of encapsulation may be applied to the first addressed interspace by tailoring the electrical DC-isolation as a ring- or frame-shaped spacer member provided along and adjacent to the periphery of the first and second electrodes. By applying to at least one of the addressed ring- or frame-shaped DC-isolating spacers distinct openings, a gas flow may be controllably generated along the periphery of the respective electrodes and the wall of the recipient so as to deal with border effects which might have an impact on the homogeneity of substrate treatment distribution.

In a further embodiment the second electrode is electrically connected to a reference potential, preferably to ground potential and further preferably to the same potential as the wall of the recipient. Thus, in this embodiment the electrode which is seen from the substrate on the substrate holder is operated on Rf potential.

This embodiment is advantageous under the aspect that there is no Rf voltage between the wall of the recipient and the second electrode. Thus, gas supply and distribution may be realized exploiting an interspace between the second electrode and the respective part of the wall as a gas distribution and equalization chamber without any considerations of electrical DC isolation and of plasma generation.

In one further embodiment of the just addressed embodiment the second electrode is realized by the wall itself of the recipient. This further simplifies the overall construction of the remote plasma source.

In a further embodiment of the apparatus according to the present invention, which may be combined with any of the embodiments as addressed to now, the substrate holder is operationally connected to a biasing electrical generator or is mounted electrically floating. By respectively selecting electric biasing on one hand or floating operation of the substrate holder, operation of the substrate most suited for a respectively intended plasma-assisted treatment is controlled substantially independently from plasma generation in the remote plasma source, nevertheless obviously depending also from the working gas or gas mixture which is applied to the interspace between the two electrodes of the remote plasma source.

Thus, by appropriately biasing electrically the substrate one may e.g. control ion bombardment in a PECVD deposition process or one may select the substrate to be exposed to a low intensity plasma distinct from the intense localized plasma discharges generated in the through-holes of the first electrode.

It must further be pointed out that the first electrode needs not necessarily be of a constant thickness all over its extent. It is absolutely possible to tailor the addressed first electrode plate with a desired thickness profile, e.g. with a profile with increased thickness along its periphery. This leads respectively to longer through-openings and thus to specifically selected plasma discharge characteristics in the involved through-openings up to generation of hollow cathode-type discharges in selected ones or in all of the addressed through-openings.

The manufacturing method according to the present invention, especially suited for manufacturing a substrate with an extent of at least 1 $m^2$, the substrate having a surface treated by a vacuum plasma assisted treatment, comprises the steps of applying a substrate into a vacuum recipient. There is generated in the vacuum recipient, remote from the substrate, a multitude of localized plasma discharges distributed distant from and distributed along the substrate extent. This is realized by means of a first electrode with through-openings facing the substrate and extending along the substrate and by a second electrode extending along, substantially parallel to and spaced from the first electrode by a spacing distance and further by applying to the addressed first and second electrodes an electric Rf plasma discharge signal. There is established a predetermined vacuum pressure in the recipient before generating the addressed plasma. A gas is inlet or fed into the interspace between the first and second electrodes. Thereby, the spacing distance between the first and the second electrodes is selected so as to at least substantially prevent plasma generation in the addressed interspace. The through-openings are selected and tailored so as to establish respectively a localized plasma discharge therein. Thereby, the manufacturing method according to the present invention makes use of a very simple but highly effective remote plasma source wherein the impact of standing waves upon the substrate may be compensated and which may be extended for treatment of large and even very large substrates larger than 3 $m^2$ without substantial expenditures. This is primarily due to the fact that the source in fact consists of the two electrode plates and one thereof having a pattern of through-openings which may easily be realized e.g. by laser cutting.

In one mode of the method according to the invention the substrate is operated electrically floatingly or is biased electrically on a selected biasing potential.

Thereby, in one mode of operation of the method according to the invention by appropriately selecting the electrical bias of the substrate one substantially governs how the substrate is interacting with the remote plasma source. E.g. by applying a respective negative DC bias, soft ion bombardment of the substrate may be established. On the other hand by another selection one may achieve that the substrate is exposed to and in fact immersed into a low-intensity plasma, but still not exposed to the high-intensity localized plasma discharges as generated by the remote plasma source.

Further, by respectively selecting the two-dimensional distribution of the through-openings in the first electrode, along the extent of that electrode and/or by appropriately selecting the thickness profile of the addressed first electrode and thereby the length extent of the addressed through-openings and/or the profile of the through-openings considered along their axial extent through the first electrode and/or shape of their openings and/or extent thereof, a negative impact of possibly occurring standing waves upon the treatment of the substrate may be compensated.

In a further mode of the method according to the invention, the first electrode is operated on a reference potential, preferably on an equipotential with the wall of the recipient, thereby preferably on ground potential. As was addressed in context with the apparatus according to the invention, one significant advantage of this operating mode is that the substrate is surrounded by walls and surfaces which are all on the same electric potential or which at least are not operated on Rf potential.

In a further mode of the method according to the invention there is established between the second electrode and a part of the wall of the recipient a further interspace. Gas or a gas mixture is fed or inlet by an arrangement of at least one inlet line through the part of the wall of the recipient and into the further interspace and from this further interspace through a pattern of distributed feed-bores in the second electrode finally into the one interspace between the two electrodes.

As was addressed above and in the frame of the method according to the invention, ignition of the localized plasma discharges in the through-openings of the first electrode may be improved by structuring at least one of the surfaces of first and second electrodes which border or delimit the addressed interspace. Thereby and with an eye on the gas feed bores through the second electrode so as to deliver gas or gas mixture from the further interspace into the one interspace such feed bores are provided opposite to and thus substantially aligned with the through-openings in which the localized plasma discharges are to be ignited. With respect to more generically conceiving the addressed surfaces for improving ignition, we refer to the respective comment in context with the apparatus of the invention.

As was addressed above the one and/or further interspace may be substantially capsulated by respective ring- or frame-shaped spacers running all around and adjacent their respective peripheries. A desired controlled lateral outflow of gas between the peripheries of the electrodes and the wall of the recipient may be established by respective lateral through-bores through such spacer rings or frames up to replacing such ring- or frame-shaped spacers by distinct posts just to mechanically and/or electrically separate the second electrode from the addressed wall of the recipient and the first electrode from the second electrode respectively.

In a further operating mode of the method according to the invention the second electrode is operated on reference potential, preferably on equipotential with the wall of the recipient, thereby preferably on ground potential.

As was addressed above the fact that the second electrode is not operated on Rf potential and is preferably operated on the same potential as the wall of the recipient has significant advantages with respect to tailoring the gas feed and -distribution system.

Thereby, in one further embodiment of the just addressed mode the wall of the recipient is directly exploited as the second electrode of the remote plasma source.

In one operating mode of the method according to the invention the substrate is treated by one of non-reactive etching, reactive plasma assisted etching, plasma-enhanced chemical vapor deposition PECVD, surface curing by interaction with ions and/or electrons and/or neutral radicals as generated in the multitude of distinct remote plasma discharges. In a further embodiment of the method according to the invention which may be combined with any operating mode addressed above the substrate manufactured has an extent of at least 1 m$^2$, even of at least 3 m$^2$.

The invention shall now further be described and thereby exemplified with the help of figures. The figures show.

Figure 1:
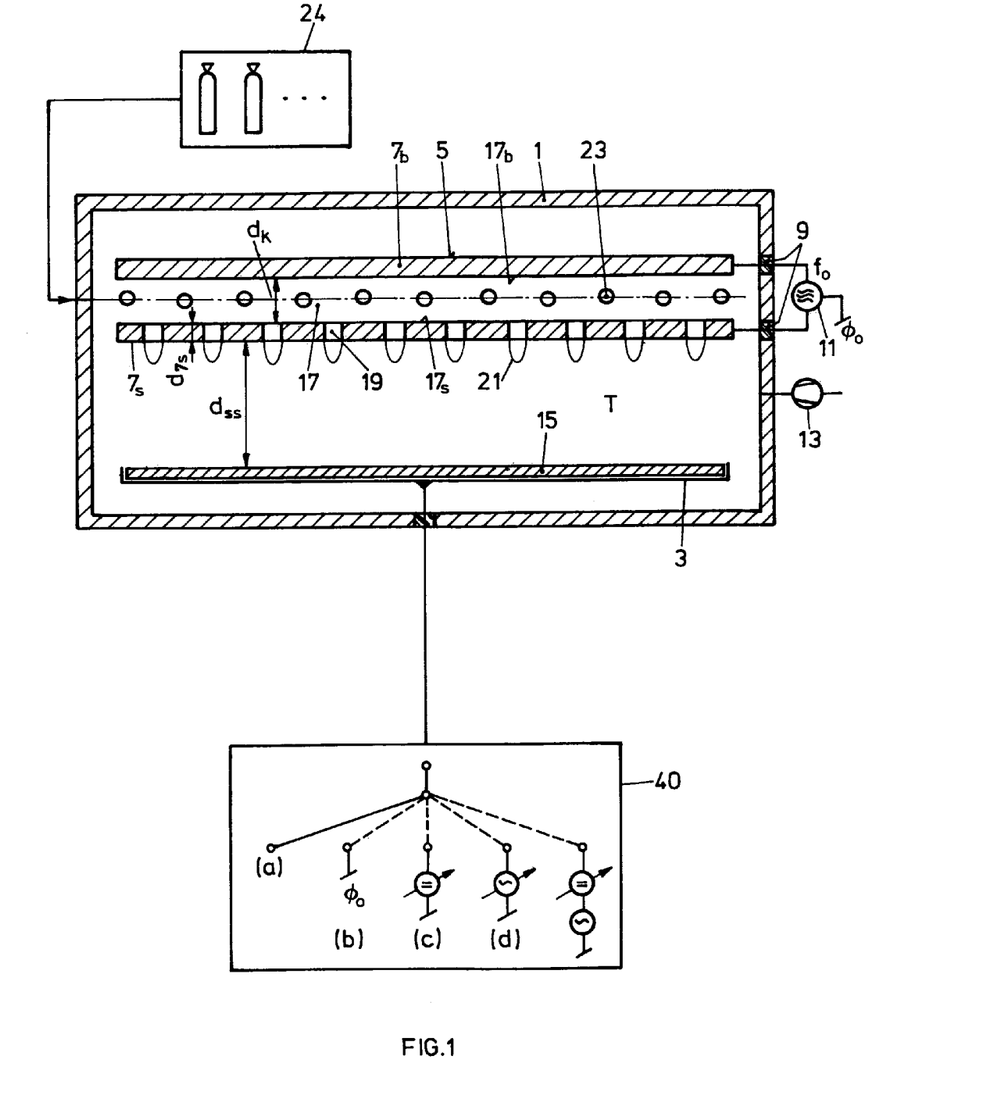
FIG. 1 schematically, an apparatus according to the invention for operating the manufacturing method of the invention, thereby showing the principle of the invention.

FIG. 1 shows schematically the principle of a plasma treatment apparatus according to the present invention and operating according to the manufacturing method of the invention. The apparatus comprises a vacuum recipient 1, a substrate holder 3 within the recipient 1 and a remote plasma source generically addressed by reference no. 5. The remote plasma source 5 comprises a first electrode $7_s$ which is plate- or sheet-like and may have an extent of at least 1 m$^2$. The remote plasma source 5 further comprises a back electrode $7_b$ which extends substantially along, parallel to and spaced from the first electrode $7_s$. Electrode $7_b$ is DC isolated with respect to the first electrode $7_s$. There is provided through the wall of vacuum recipient 1 an Rf-feedthrough schematically shown at 9, to which an Rf generator 11 is connected. The vacuum recipient 1 is evacuated by means of a pumping arrangement 13. Robot as well as loadlock arrangements are provided (not shown) to load and unload a substrate 15 or substrates to be simultaneously treated on substrate holder 3. If we speak of a substrate 15 with a specific minimal extent we also understand two or more distinct substrates which are to be simultaneously treated and which all together define for a substrate surface with the addressed minimal extent.

Rf power at a predetermined frequency $f_o$ in a range of several hundred KHz up to several hundred MHz, preferably of 13.56 MHz, or harmonics thereof, e.g. 27 MHz, 40 MHz, 54 MHz etc. and higher is applied to the two electrodes $7_b$ and $7_s$.

The two electrodes $7_b$ and $7_s$ define for an interspace 17.

In spite of the fact of high Rf power being applied between the two electrodes $7_b$ and $7_s$, plasma generation in the interspace 17 is at least substantially prevented. This is reached by establishing a spacing dk between the opposite surfaces $17_b$ and $17_s$ of the electrodes $7_s$, $7_b$ to be smaller than the dark space distance which prevails for the selected frequency $f_o$, the Rf power $P_{RF}$ and the gas or gas mixture pressure p which is to be established during operation in the interspace 17. The spacing dk to be established between the addressed surfaces of electrodes $7_b$, $7_s$ to prevent plasma ignition in the interspace 17 may be evaluated experimentally for the addressed predetermined frequency $f_o$ of Rf power, the Rf power $P_{RF}$ and the pressure of gas or gas mixture to be used during operation of the apparatus.

The first electrode $7_s$ has a pattern of through-openings 19. The through-openings may have rather cylindrical shape as shown in FIG. 1. Nevertheless, they may specifically be tailored with a different profile considered along their axial extent e.g. with abruptly or continuously changing diameter and may further be tailored also elliptically etc. Further, the addressed pattern needs not be regular in that sense that there is provided an equal number of through-openings per surface unit all along the extent of electrode $7_s$. As for compensating an impact of possibly occurring standing waves upon the treatment of the substrate, the number of through-holes per surface area of the electrode $7_s$, their respective geometry and extent is appropriately selected varying along the extent of electrode $7_s$.

Further, and still with an eye on FIG. 1, the electrode $7_s$ needs not necessarily have a constant thickness all over its extent, but may be conceived with a specifically tailored thickness profile. This clearly influences also the axial extent of the addressed through-openings 19 and thereby may be one parameter to establish for the addressed compensating of standing wave effects.

At each of the through-openings 19 which are distributed according to a desired pattern along the extent of the electrode $7_s$, localized plasma discharges 21 are generated, due to the Rf signal applied to the two electrodes $7_b$ and $7_s$.

As was addressed, the through-openings 19 are normally circular. Nevertheless, the exact shape or shapes of the through-openings 19, their extent as e.g. their diameter in the case they are circular, their distribution along the surface of electrode $7_s$ which may be even or which may be e.g. denser along the periphery of the electrode $7_s$, e.g. for dealing with border effects and/or standing waves, is evaluated by experiment and at the process conditions predetermined especially with respect to Rf frequency, Rf power and gas or gas mixture pressure, so as to result in a desired homogeneity of treatment density along the surface of substrate 15.

A pattern of gas inlet openings 23 abut into the interspace 17. They communicate with a gas tank arrangement 24. The gas or gas mixture to be applied is selected dependent on the treatment process to be performed upon the substrate 15. E.g. a noble gas, as e.g. Argon, may be inlet for non-reactive ion etching of the surface of substrate 15 and/or a reactive gas which is activated by the plasma torches 21 e.g. for reactive etching or plasma enhanced chemical vapor deposition, PECVD at e.g. low ion bombardment.

Figure 2:
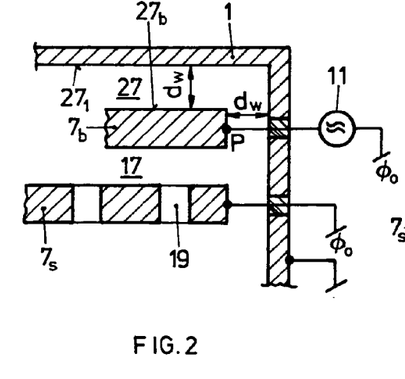
FIG. 2 in a schematic cross-sectional representation, a part of the apparatus according to FIG. 1, showing one embodiment of the apparatus according to the invention for operating one mode of the method according to the invention.

According to FIG. 2 the electrode $7_b$ as of FIG. 1 is operated on Rf potential, whereas the electrode $7_s$ is operated on a reference potential $\Phi_o$, customarily ground potential. The wall of recipient 1 is as customary also operated on the addressed reference potential $\Phi_o$. In this case the same Rf potential difference or Rf voltage will be present between the back surface of electrode $7_b$ and the inner surface of the wall of recipient 1 as is present across interspace 17. Therefore and to prevent plasma ignition between the back surface of electrode $7_b$ and inner surface of the wall of recipient 1 the spacing between the back surface 27 $b$ of electrode $7_b$ and the inner surface $27_1$ of the wall of recipient 1 addressed by $d_w$ in FIG. 2 is tailored to prevent plasma discharge in the interspace 27.

As will be addressed just below, gas pressure within interspace 27 needs not necessarily be equal to gas pressure in the interspace 17 and both gas pressures may differ from the gas pressure established in the processing space T as addressed in FIG. 1. Nevertheless and with respect to prevention of plasma generation within the interspace 27, the same considerations prevail as with respect to such prevention in interspace 17. Principally, the respective spacings must be smaller than dark space distance at the respective gas or gas mixture pressures and in dependency of Rf frequency and power. As was already addressed, it might be critical to establish the addressed maximum spacings at the interspaces 17 and 27 without experiments if it is desired to realized the addressed spacings up to the maximum possible, thereby still avoiding the addressed plasma generation.

Clearly, if it is not desired to exploit maximum possible spacings, the addressed spacings are selected to be well below the critical spacing where plasma generation is likely to occur.

Nevertheless, all the distances of surfaces which delimit an interspace which is loaded by Rf power and at which generation of a plasma is to be avoided, may be made larger if such interspaces are subdivided by respective grid members which reduce the overall capacitance between the addressed surfaces which delimit the interspace. Thus and with an eye on FIG. 1 a floating grid may be introduced between the electrodes $7_s$ and $7_b$ which reduces appearing capacitance between surface $17_b$ and surface $17_s$ and thus allows to enlarge the distance dk.

Figure 3:
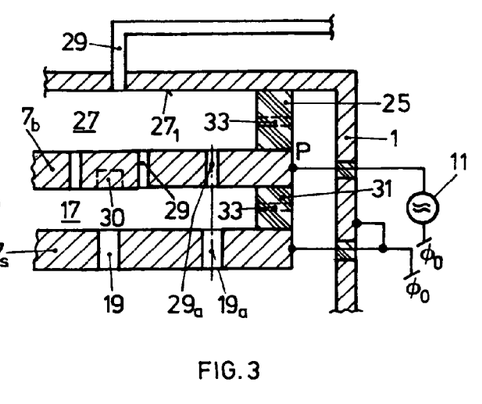
FIG. 3 in a representation in analogy to that of FIG. 2, a further embodiment with a gas distribution system, thereby operating one mode of the method according to the invention.

FIG. 3 shows in a representation in analogy to that of FIG. 2 one possibility to feed the gas or gas mixture as was addressed in context with FIG. 1 evenly distributed or with a predetermined distribution into the interspace 17.

Thereby, the electrical DC isolation 25 which is mandatory between electrode $7_b$ and the inner surface $27_1$ of the wall of recipient 1 is conceived as an isolating ring or frame which encapsulates the second interspace 27. This interspace 27 may thus be exploited as gas distribution space to which, by one or more than one gas inlet lines 29 the desired gas or gas mixture is applied.

As shown in FIG. 3 the electrode $7_b$ is provided with a desired pattern of through-bores 29 through which the gas or gas mixture is inlet from interspace 27 to interspace 17. By respectively selecting the distribution and the respective diameters and lengths of the through-bores 29 a desired gas inflow distribution may be selected into interspace 17. As further also addressed in FIG. 3 the interspace 17 may also be capsulated by an insulating spacer ring or frame 31 along the periphery of electrodes $7_b$ and $7_s$.

It is to be noted that through-bore $29_a$ is axially aligned with one of the through-openings 19 so as to establish, adjacent to the addressed through-opening 19, a surface structure with a corner (spout of opening 19$a$). This facilitates or improves ignition of the localized plasma.

With the same object of improving ignition FIG. 3 shows a blind hole 30 substantially aligned with one of the through-openings 19.

The embodiments of FIGS. 2 and 3 are today preferred.

Figure 4:
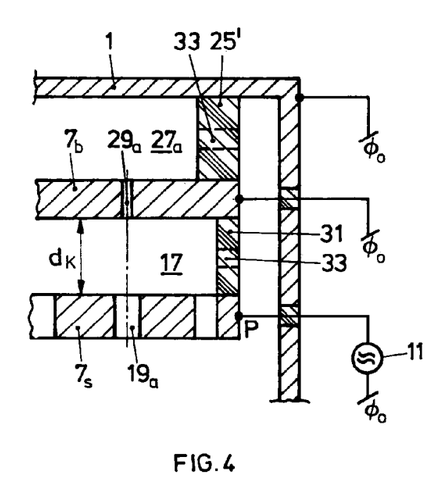
FIG. 4 in a representation according to those of the FIG. 2 or 3, a further embodiment of the apparatus according to the invention operating one mode of the method according to the invention.

FIG. 4 is a representation in analogy to that of FIG. 2. Here the electrode $7_b$ is operated on reference potential $\Phi_o$ equally to the wall of the recipient 1, customarily on ground potential.

It is the electrode $7_s$ with the plasma torch openings 19 which is operated on Rf potential. Thereby, again an interspace $27_a$ in analogy to interspace 27 of FIG. 3 may be established as a gas distribution chamber. As interspace 27 of FIG. 4 is surrounded by walls on electrically equipotential, there is no need to care about ignition of a plasma therein. With respect to interspace 17 and spacing dk the same considerations prevail as were addressed in context with FIG. 1. As also shown in FIG. 4 the interspace 17 may be capsulated equally as in the embodiment of FIG. 3 by a DC-insulating spacer ring or frame 31. The embodiment of FIG. 4 opens a wide variety of constructional variants and gas feed techniques because electrode $7_b$ and the wall of recipient 1 are operated on equal electrical potentials. Thus and according to the embodiment of FIG. 5 the wall of the recipient 1 may directly be exploited as electrode $7_b$. In this embodiment the gas supply with a desired gas distribution to the interspace 17 may easily be realized by a respective distribution chamber and distribution piping in and/or outside the wall of the recipient 1 (not shown in FIG. 5).

As addressed to now within the plasma treatment apparatus according to the invention there is provided a wide areal aerial, remote plasma source 5 established especially by the two parallel extended electrodes $7_b$ and $7_s$ provided with a plasma-preventing spacing and with the through-holes in electrode $7_s$ wherein localized plasma discharges are generated.

Figure 5:
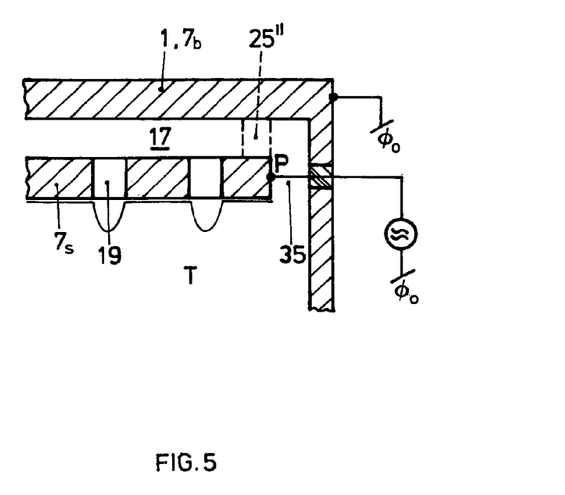
FIG. 5 still in a representation in analogy to those of the FIGS. 2 to 4, a further embodiment of the apparatus according to the invention operating a further mode of the method according to the invention.

With an eye on the embodiments according to FIG. 3 or 5, it has to be mentioned that instead of providing insulating spacer rings or frames as of 25, 31, 25' and 25" in FIG. 5, which provide for a substantial capsulation of the respective interspaces 27, 17, 27$a$, respective lateral gas distribution bores as shown at 33 in FIGS. 3 and 4 through such isolating spacer rings or frames may be provided to establish for a desired and controlled gas flow laterally along the periphery of the respective electrodes $7_b$, $7_s$ and along the wall of recipient 1, so as to take into account peripheral effects at the addressed area including effects as caused by standing waves. It may even be desired to establish mutual spacing and where necessary mutual DC-isolation, by distinct spacer posts mounted and distributed along the periphery of the respective electrodes $7_b$ and $7_s$ and the wall of recipient 1.

Electrode $7_s$ which is provided with the local plasma discharge through-holes 19 has preferably a thickness $d_{7s}$ according to FIG. 1 of $$1\text{ mm} \leq d_{7s} \leq 15\text{ mm}.$$

Thereby, and if $d_{7s}$ is selected in the range between 5 and 15 mm, thereby preferably 10 mm, the localized plasma discharges generated within the through-holes 19 may further be of hollow cathode-type. Additionally, the through-holes 19 lead then to a pronounced directional gas ejection towards the substrate holder 3 and thus substrate 15. The plasma in the respectively long through-holes 19 intensely interacts with the outflowing gas.

In opposition, if the thickness $d_{7s}$ of electrode $7_s$ is selected below 5 mm and even down to 1 mm, the electrode $7_s$ becomes very light-weight and the through-openings 19 may very easily be realized as by laser cutting. As the electrode $7_s$ may have an extent of at least 1 m$^2$ and more, spacing posts may become necessary within interspace 17 to support the electrode sheet. Such spacing posts of DC-insulating material may be provided distributed along the extent of electrode sheet to establish stability thereof.

The through-holes 19 in the electrode $7_s$ have diameters of 1 to 30 mm, thereby preferably of 8 to 15 mm, further preferred of 10 mm.

Having a look at the electrical condition of the various embodiments exemplified up to now, it is evident that in the embodiment according to the FIGS. 2 and 3 the space T according to FIG. 1 in the vacuum recipient, wherein the substrate holder 3 with substrate 15 resides, is substantially bordered by conductive surfaces operated on reference potential. Thus, the substrate holder 3 is practically not influenced by the Rf power applied to the remote plasma source 5.

In the embodiment according to the FIGS. 4 and 5 it is the electrode $7_s$ which is operated on Rf potential. Along its periphery electrode $7_s$ is adjacent to the wall of the recipient 1 which is on reference potential, customarily on ground potential. Therefore, in this embodiment it is likely that the localized plasma discharges in the through-holes 19 expand as a relatively thin plasma layer all along that surface of the electrode $7_s$ which points towards the space T and thus towards substrate holders 3 as shown at 35 in FIG. 5. Nevertheless, such plasma layer does not expand as a high intensity plasma into the space T and remains located just upon the electrode surface. Thus, also in this embodiment the substrate holder 3 and thus substrate 15 held thereon may be operated substantially not affected by the Rf power applied to the remote plasma source, taking into account the highly conductive plasma layer 35.

Thus, in both embodiments the two-electrode plasma-generating source with electrodes $7_b$ and $7_s$ is a remote plasma source with respect to the substrate holder 3. The electrical conditions at the substrate holder 3 and thus at the substrate 15 may be set substantially independent from the electric Rf power applied to the remote plasma-generating source 5. As was already addressed with an eye on gas flow along the periphery of the remote plasma source 5, in context with through-bores 33 of FIG. 4, by means of controlling gas flow towards the space T of FIG. 1, border effects which possibly lead to inhomogeneous treatment distribution along a substrate 15 may be compensated. This may also be realized e.g. by providing through-bores 19 along the periphery of electrode $7_s$ with a different distribution than in central areas of electrode $7_s$, e.g. by providing more through-bores along the addressed periphery per cm². Alternatively, the addressed through-bores along the periphery of electrode $7_s$ may be different in diameter than through-bores located more centrally at the addressed electrode $7_s$, having e.g. larger diameters.

Moreover and as was already addressed a negative impact of possibly arising standing waves upon the treatment of the substrate may be compensated by generically appropriately tailoring the distribution of localized plasma discharges at electrode $7_s$ and/or of their respective characteristics. Thus, by appropriately selecting the amount of through-holes per unit of surface area of electrode $7_s$ to vary along the extent of the addressed electrode and/or of the diameter of such openings and/or of the geometry of such openings along their axial extent through electrode $7_s$, appropriate standing wave effect compensation is achieved.

Thus and also for manufacturing purposes, the through-bores 19 are preferably circular, but their shape may also be varied and also varied along the extent of electrode $7_s$ for selectively influencing treatment distribution along the substrate 15.

After having discussed and explained the realization and the functioning of the remote plasma source 5 within recipient 1, electrical operation of substrate holder 3 and thus of substrate 15 shall be addressed, again with an eye on FIG. 1.

As schematically shown in FIG. 1 by means of an "option-selecting" unit 40, the substrate holder 3 may be operated electrically floatingly as of option (a) or on reference potential $\Phi_o$, as addressed by option (b) or on a selected DC potential as of option (c). According to option (d) the substrate holder is biased on an AC potential ranging from several KHz up to several MHz and including pulsed biasing. According to option (e) biasing is performed by DC plus AC. As schematically shown all biasing sources are preferably adjustable.

Thereby, unless operated electrically floatingly, there is applied to the substrate support 3 a biasing DC and/or AC potential by which ion bombardment and electron loading of the substrate may be selectively controlled to establish a desired surface treatment of the large-area substrate 15. Due to the remote plasma source 5 with distinct localized plasma discharges spread along the source surface the effects of possibly occurring standing waves are accurately compensated. By electrically feeding the Rf potential-operated electrode, i.e. electrode $7_b$ of FIGS. 2 and 3, electrode $7_s$ according to the embodiments of FIGS. 4 and 5, at more than one feeding point P, e.g. at two or four feeding points evenly distributed along the periphery and/or centrally of the addressed electrode, the standing waves which negatively impacts the homogeneity of plasma treatment along the large-surface substrate 15 may be additionally attenuated.

As was already addressed, the today's preferred embodiment of the apparatus according to the invention and operating the manufacturing methods of the invention is conceived according to the FIGS. 2 and 3, especially with respect to electrical operation of electrode $7_s$. The today realized embodiment is operated at an Rf frequency $f_o$ of 40 MHz, whereby the spacing at interspace 27 and interspace 17 is selected to be 1 to 5 mm, thereby especially to be about 3 mm.

The distance $d_{ss}$ as shown in FIG. 1 between the surface of electrode $7_s$ and substrate holder 3 or surface of substrate 15 is between 8 and 60 mm, thereby preferably between 10 and 40 mm depending on pressure, frequency, gases used and their flows.

By the described plasma treatment apparatus large-surface substrates 15 are manufactured, the surface thereof being homogeneously treated by a plasma-assisted treatment. Such a treatment may e.g. be surface etching, be it reactive or non-reactive, material deposition, surface treatment without removing or adding material or by changing material composition at the surface of the substrate, heat treatment etc.

The apparatus as described and the method of substrate manufacturing as realized by such apparatus may be expanded to large or even very large substrates with surfaces of more than 3 m². Thereby, the remote plasma source as addressed is of very simple construction which allows the addressed expansion to such sources without highly expensive and complicated manufacturing operations for the remote plasma source.

On one hand the treated substrate surface is substantially de-coupled from plasma generation at the remote sources, on the other hand standing wave problems are effectively compensated and a highly intense interaction of gases as applied and of the plasma as generated by the remote plasma source is achieved. The effect of radicals, ions and electrons upon the surface to be treated may substantially be selected and controlled by the substrate bias, largely independent from plasma generation. The remote plasma source incorporated in the apparatus is of very simple construction. Even if multiple-point Rf feed to the remote plasma source and/or for biasing the substrate is possibly desired to improve homogeneity of surface treatment and/or to avoid the effect of standing waves, this is easily accomplished due to the simple structure of the overall apparatus.

What is claimed is:

1. A plasma treatment apparatus comprising:
a vacuum chamber;
a substrate holder for a substrate to be treated;
a remote plasma source;
wherein said remote plasma source comprises:
   a first plate-like, two-dimensionally extending, electrically conductive electrode;
   a second two-dimensionally extending, electrically conductive electrode;
   said first and said second electrodes being substantially parallel and mutually electrically DC-isolated;
   said first and said second electrodes being operationally connected to an electrical Rf generator generating an Rf signal at a predetermined frequency and with a predetermined power;
   said first electrode having a surface freely exposed to said substrate holder and having a back surface, and further comprising a pattern of through-openings distributed along the first electrode's surface extent;
   said second electrode having a surface exposed to said back surface of said first electrode and spaced therefrom by a distance thereby defining an interspace between said back surface of said first electrode and said exposed surface of said second electrode;
   a pattern of gas inlet openings abutting said interspace and positioned to fill the interspace with gas input from the gas inlet openings;
   said through-openings in the first electrode being dimensioned to establish a plurality of localized plasma discharges distributed along the first electrode within said through-openings at said predetermined Rf frequency, at said predetermined power and at a predetermined gas pressure;
   said distance between the first and second electrodes being such that plasma generation in said interspace is substantially prevented at that said predetermined Rf frequency, said predetermined power and said predetermined gas pressure in said interspace.

2. The apparatus of claim 1, wherein said second electrode extends adjacent to, along and spaced from a wall of said chamber.

3. The apparatus of claim 2, wherein the distance between said wall and said second electrode defines a further interspace, at least one gas inlet line being provided through said wall and abutting said further interspace, a pattern of further gas inlet lines being provided from said further interspace through said second electrode and abutting said one interspace.

4. The apparatus of claim 1, wherein said first electrode is electrically connected to an electric reference potential.

5. The apparatus of claim 4, wherein a wall of said chamber is also electrically connected to an electric reference potential.

6. The apparatus of claim 1, wherein said second electrode is electrically connected to an electric reference potential.

7. The apparatus of claim 6, said second electrode being realized by a part of the wall of said chamber.

8. The apparatus of claim 1, wherein said substrate holder is operationally connected to a biasing electrical generator or is mounted electrically floating.

9. The apparatus of claim 1, said substrate holder configured to hold a substrate of at least 1 m$^2$.

10. The apparatus of claim 1, wherein said second electrode is electrically connected to the same electric potential as a wall of said chamber.

11. The apparatus of claim 1, wherein said through-openings have diameters of 8 to 15 mm.

12. The apparatus of claim 1 wherein the interspace between the first and second electrodes is approximately 1 mm to 5 mm.

13. The apparatus of claim 1 wherein a distribution of through-openings along the first electrode has a variable through-opening distribution density.

14. The apparatus of claim 13 wherein the through-openings have a greater density in a peripheral region of the first electrode.

15. The apparatus of claim 1 wherein the through openings comprise through-bores having a central axis that is substantially perpendicular to the interspace region.

16. A method for manufacturing substrates with a surface treated by a vacuum plasma assisted treatment, the method comprising:
   positioning a substrate into a vacuum chamber;
   generating remote from said substrate a plurality of localized plasma discharges distributed along said substrate by means of a first electrode with through-openings facing said substrate and distributed in a direction extending along said substrate, and a second electrode extending adjacent, substantially parallel to, and spaced from said first electrode by a spacing distance, the spacing distance selected such that plasma generation is prevented in an interspace between the first and second electrodes;
   applying to said first and second electrodes an electric Rf plasma discharge signal;
   establishing a predetermined vacuum pressure in said chamber before generating said plurality of localized plasma discharges;
   feeding a gas into the interspace between said first and said second electrodes; and
   selecting dimensions of said through-openings so as to establish the plurality of localized plasma discharges therein.

17. The method of claim 16, further comprising applying to said substrate an electrical biasing potential or operating said substrate electrically floatingly.

18. The method of claim 16, further comprising operating said first electrode on a reference potential.

19. The method of claim 16, further comprising establishing between said second electrode and a wall of said chamber a further interspace, feeding said gas by an arrangement of at least one inlet line through said wall and into said further interspace and from said further interspace through a pattern of distributed inlet bores in said second electrode into said one interspace.

20. The method of claim 16, further comprising operating said second electrode on a reference potential.

21. The method of claim 20, further comprising using the wall of said chamber as said second electrode.

22. The method of claim 16, said substrate being treated by one of non-reactive etching, reactive plasma-assisted etching, plasma-enhanced chemical vapor deposition, or curing of the surface of the substrate by interaction with ions and/or electrons and/or neutral radicals.

23. The method of claim 16, wherein said substrate is at least 1 m$^2$.

24. The method of claim 18, further comprising operating said first electrode on a reference potential at equipotential with a wall of said chamber.

25. The method of claim 20, further comprising operating said second electrode on a reference potential at equipotential with a wall of said chamber.

* * * * *

UNITED STATES PATENT AND TRADEMARK OFFICE
CERTIFICATE OF CORRECTION

PATENT NO.         : 8,518,284 B2                                              Page 1 of 1
APPLICATION NO.    : 12/989967
DATED              : August 27, 2013
INVENTOR(S)        : Ulrich Kroll et al.

It is certified that error appears in the above-identified patent and that said Letters Patent is hereby corrected as shown below:

In the specification, column 9, line 4, please delete "*b*of" and replace with -- *b* of --

Signed and Sealed this
Nineteenth Day of November, 2013

Teresa Stanek Rea
*Deputy Director of the United States Patent and Trademark Office*